(12) United States Patent
Shin et al.

(10) Patent No.: US 7,402,484 B2
(45) Date of Patent: Jul. 22, 2008

(54) METHODS FOR FORMING A FIELD EFFECT TRANSISTOR

(75) Inventors: Hyunsoo Shin, Seoul (KR); Kyusung Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 81 days.

(21) Appl. No.: 10/956,311

(22) Filed: Sep. 30, 2004

(65) Prior Publication Data

US 2005/0142729 A1 Jun. 30, 2005

(30) Foreign Application Priority Data

Dec. 30, 2003 (KR) ............... 10-2003-0100531

(51) Int. Cl.
*H01L 21/8238* (2006.01)

(52) U.S. Cl. .............. 438/231; 438/528; 438/595; 257/E21.335; 257/E21.634; 257/E21.635

(58) Field of Classification Search ............... 438/149, 438/151, 197, 199, 229, 230, 303, 364, 479, 438/595, 528, 231; 257/E21.335, E21.634, 257/E21.635

See application file for complete search history.

(56) References Cited

U.S. PATENT DOCUMENTS

| | | | | |
|---|---|---|---|---|
| 5,324,974 A | * | 6/1994 | Liao | 257/344 |
| 5,424,570 A | * | 6/1995 | Sardella et al. | 257/333 |
| 5,691,212 A | * | 11/1997 | Tsai et al. | 438/297 |
| 6,146,946 A | * | 11/2000 | Wang et al. | 438/264 |
| 6,251,763 B1 | * | 6/2001 | Inumiya et al. | 438/595 |
| 6,252,283 B1 | * | 6/2001 | Gardner et al. | 257/407 |
| 6,352,900 B1 | * | 3/2002 | Mehrotra et al. | 438/305 |
| 6,362,085 B1 | * | 3/2002 | Yu et al. | 438/585 |
| 6,380,102 B1 | * | 4/2002 | Oh | 438/771 |
| 6,391,732 B1 | * | 5/2002 | Gupta et al. | 438/305 |
| 6,432,784 B1 | * | 8/2002 | Yu | 438/303 |
| 6,440,807 B1 | * | 8/2002 | Ajmera et al. | 438/300 |
| 6,489,236 B1 | * | 12/2002 | Ono et al. | 438/664 |
| 6,503,826 B1 | * | 1/2003 | Oda | 438/624 |
| 6,602,754 B1 | * | 8/2003 | Kluth et al. | 438/303 |
| 6,693,013 B2 | * | 2/2004 | Bae et al. | 438/303 |
| 6,713,357 B1 | * | 3/2004 | Wang et al. | 438/287 |
| 6,720,626 B1 | * | 4/2004 | Igarashi | 257/368 |
| 6,753,232 B2 | * | 6/2004 | Kwak et al. | 438/301 |
| 2002/0022376 A1 | * | 2/2002 | Oh | 438/770 |
| 2002/0076877 A1 | * | 6/2002 | Gupta et al. | 438/230 |
| 2002/0102800 A1 | * | 8/2002 | Van Den Heuvel | 438/301 |
| 2002/0117698 A1 | * | 8/2002 | Inumiya et al. | 257/288 |
| 2003/0003670 A1 | * | 1/2003 | Kwak et al. | 438/303 |
| 2003/0022429 A1 | * | 1/2003 | Matsumura | 438/230 |
| 2004/0127006 A1 | * | 7/2004 | Hahn | 438/595 |
| 2004/0171225 A1 | * | 9/2004 | Igarashi | 438/305 |
| 2005/0124105 A1 | * | 6/2005 | Kanemoto | 438/197 |

* cited by examiner

*Primary Examiner*—Michael S. Lebentritt
*Assistant Examiner*—Stanetta D Isaac
(74) *Attorney, Agent, or Firm*—Andrew D. Fortney

(57) ABSTRACT

Methods for forming a field effect transistor are disclosed. An illustrated method comprises: forming a gate electrode on a substrate; and forming a nitride layer on at least a part of the gate electrode and the substrate.

14 Claims, 4 Drawing Sheets

METHODS FOR FORMING A FIELD EFFECT TRANSISTOR

FIELD OF THE DISCLOSURE

The present disclosure relates generally to semiconductor fabrication; and more particularly, to methods for forming a field effect transistor (FET).

BACKGROUND

A field effect transistor (FET) (which is essential to the operation of some semiconductor devices such as a complementary metal oxide semiconductor (CMOS) transistor), includes a gate electrode, a source and a drain.

FIG. 1 is a flow chart illustrating a conventional method for forming a CMOS transistor. First, a device isolation layer is formed in predetermined regions of a semiconductor substrate to define an active region and a field region (block S1). The device isolation layer, (usually referred to as a field oxide layer), is typically formed by performing a local oxidation of silicon (LOCOS) method or a shallow trench isolation (STI) method.

Next, well regions are formed in the semiconductor substrate where the CMOS transistors will be formed (block S2). Specifically, an N well region is formed in a PMOS transistor region of the semiconductor substrate and a P well region is formed in an NMOS transistor region of the semiconductor substrate.

Subsequently, gate electrodes are formed on the well regions by forming a gate oxide layer and a polysilicon layer, and then etching them while using a gate mask pattern (block S3).

Next, a screen oxide layer is formed on an upper surface of the gate electrode, on the semiconductor substrate and on the sidewalls of the gate electrode by performing a re-oxidization process (block S4). The screen oxide layer cures or compensates for degradation of the gate oxide layer of the gate electrodes, which results from the etching process for forming the gate electrodes represented by block S3. Moreover, the screen oxide layer serves to protect the semiconductor substrate when an ion implantation process for forming a lightly doped drain (LDD) region is subsequently performed.

Next, LDD region is formed by performing the ion implantation process to avoid hot carrier creation due to the peak electric field in a drain edge of, for example, the NMOS transistor (block S5). The LDD region is formed so that its edges are aligned with the edges of the gate electrode.

Next, spacers are formed on the sidewalls of the gate electrodes (block S6). The spacers have a conventional structure consisting of a spacer nitride layer, a buffer oxide layer and a sealing nitride layer (N/O/N structure).

Subsequently, source/drain regions are formed in alignment with the edges of the spacers and expanded from the LDD regions by an ion implantation process (block S7).

Next, a silicide layer is formed on the source/drain regions in order to reduce the contact resistance thereof (block S8). This completes the fabrication of the CMOS transistor.

However, because the re-oxidation process for forming the screen oxide layer is performed at a high temperature for a long time, the well region and a channel region below the gate electrodes, (which have been formed before the re-oxidization process), are affected by the re-oxidation process, thereby degrading characteristics of the transistor such as the threshold voltage.

BRIEF DESCRIPTION OF THE DRAWINGS

Like parts appearing in FIGS. 3A to 3F are represented by like reference characters.

DETAILED DESCRIPTION

Figure 1:
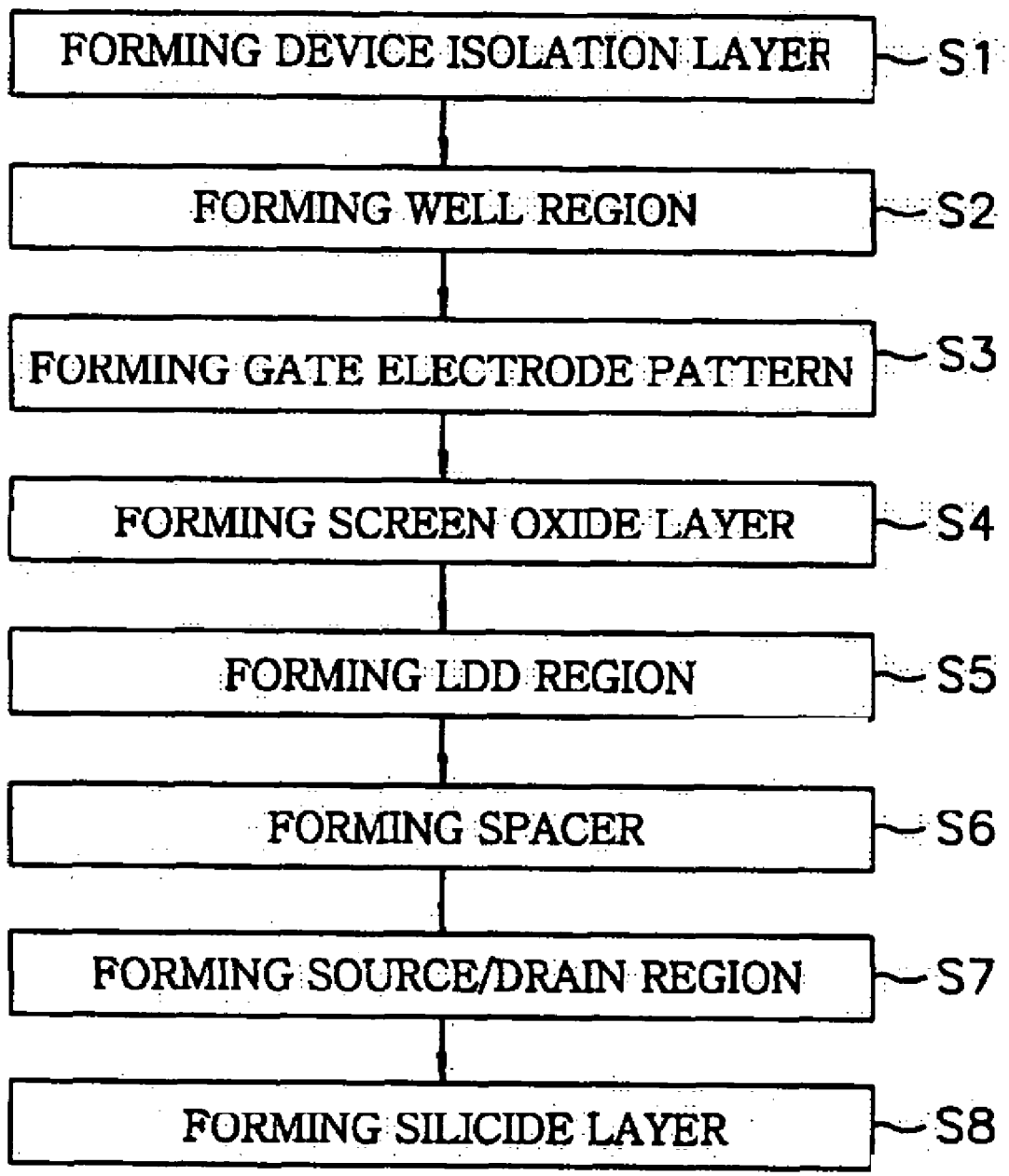
FIG. 1 is a flow chart illustrating a conventional method for forming a CMOS transistor.
Figure 2:
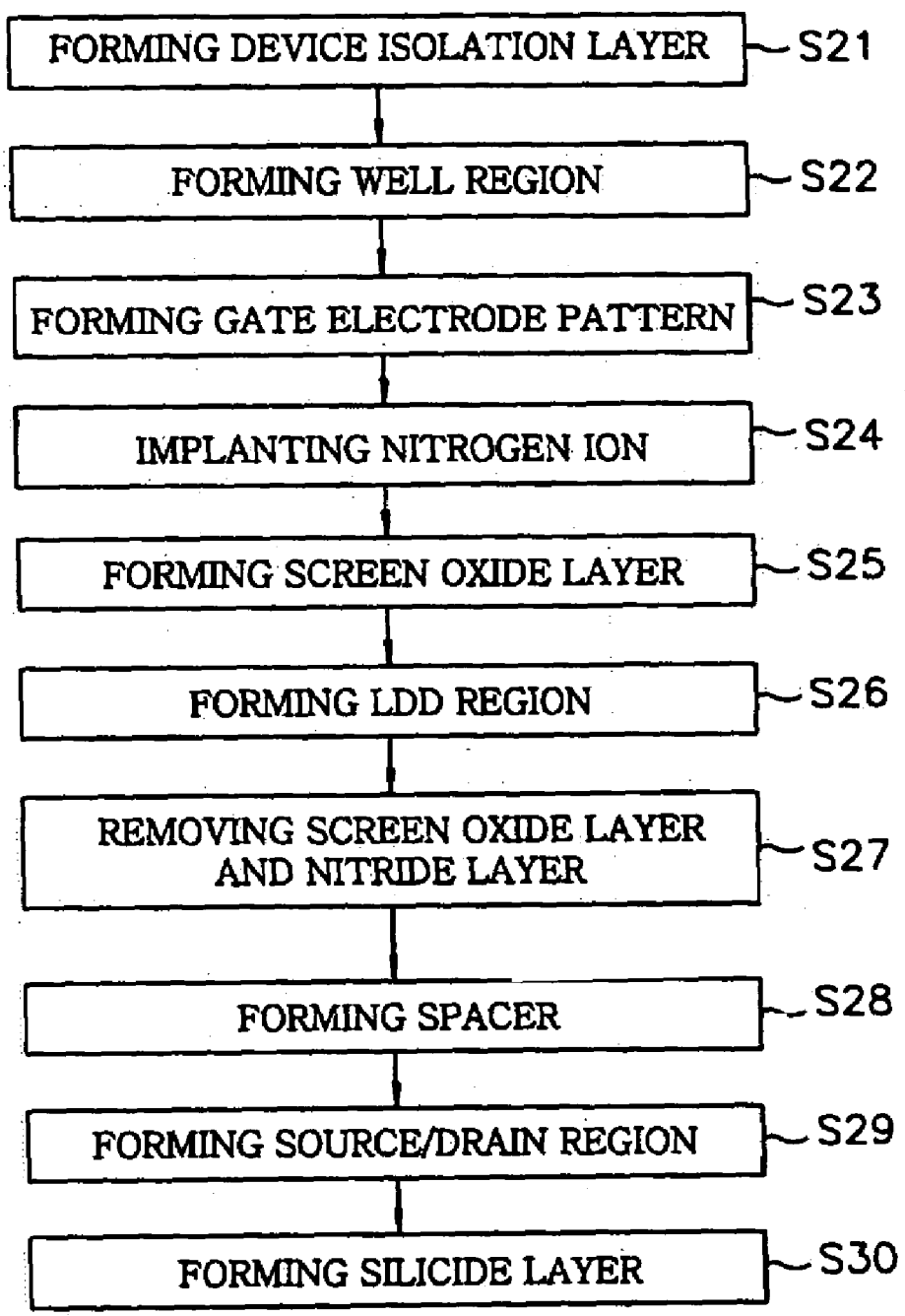
FIG. 2 is a flow chart illustrating an example method for forming a CMOS transistor performed in accordance with the teachings of the present invention.

FIG. 2 is a flow chart illustrating an example method for forming a CMOS transistor. In the example process of FIG. 2, at least one device isolation layer is formed in a predetermined region of a semiconductor substrate to define an active region and a field region (block S21). In the illustrated example, the device isolation layer(s), (usually referred to as field oxide layers), are formed by performing a local oxidation of silicon (LOCOS) method or a shallow trench isolation (STI) method.

Next, well regions are formed in the semiconductor substrate on which CMOS transistors will be formed (block S22). Specifically, an N well region is formed in a PMOS transistor region of the semiconductor substrate and a P well region is formed in an NMOS transistor region of the semiconductor substrate.

Subsequently, gate electrodes are formed by forming a gate oxide layer and a polysilicon layer, (i.e., a gate conducting layer), and then etching them while using a mask (block S23).

Next, a nitrogen ion implantation process is performed on an upper surface of the gate electrodes and on the semiconductor substrate, so that a thin nitride layer doped with nitrogen is formed on the upper surface of the gate electrodes and on the semiconductor substrate (block S24). In the illustrated example, the thickness of the nitride layer is less than or equal to about 30 Å.

The aforementioned nitrogen ion implantation process is performed with energy of about 10 KeV~160 KeV at a dose of about $1 \times 10^{13}$ ions/cm$^2$~$1 \times 10^{16}$ ions/cm$^2$, and an ion implantation angle of about 0°~7°, so that nitrogen ions are projected almost perpendicularly to the semiconductor substrate. The nitride layer may be formed by using plasma instead of the nitrogen ion implantation process mentioned above.

The nitride layer serves to expedite growth of an oxide layer, (i.e., a screen oxide layer), in a subsequent re-oxidization process.

The screen oxide layer is formed by performing a re-oxidization process on the surface of the nitride layer and the sidewalls of the gate electrodes (block S25). The screen oxide layer cures or compensates for a degradation of the gate oxide layer incorporated in the gate electrodes, which results from the etching process represented by block S23. Moreover, the screen oxide layer serves to protect the semiconductor substrate when an ion implantation process for forming a lightly doped drain (LDD) region is subsequently performed.

Next, LDD regions are formed to avoid hot carrier creation due to a peak electric field in a drain edge of, for example, the NMOS transistor by performing an ion implantation process (block S26). In the illustrated example, the LDD region is formed so that its edges are aligned with the edges of the gate electrodes.

The screen oxide layer on the gate electrodes, on the semiconductor substrate, and on the sidewalls of the gate electrodes is then removed by performing, for example, a sulfuric cleaning process (block S27). The nitride layer is also removed.

Next, spacers are formed on the sidewalls of the gate electrodes (block S28). The spacers have a structure including a spacer nitride layer, a buffer oxide layer and a sealing nitride layer (N/O/N structure). In some examples, the spacers may consist exclusively of a spacer nitride layer, a buffer oxide layer and a sealing nitride layer.

Subsequently, source/drain regions are formed by performing an ion implantation process (block S29). The source/drain regions are in alignment with corresponding edges of the spacers and expand from adjacent LDD regions.

Next, a silicide layer is formed on the source/drain regions in order to reduce the contact resistance (block S30). The fabrication of the CMOS transistor is, thus, completed.

Figure 3A:
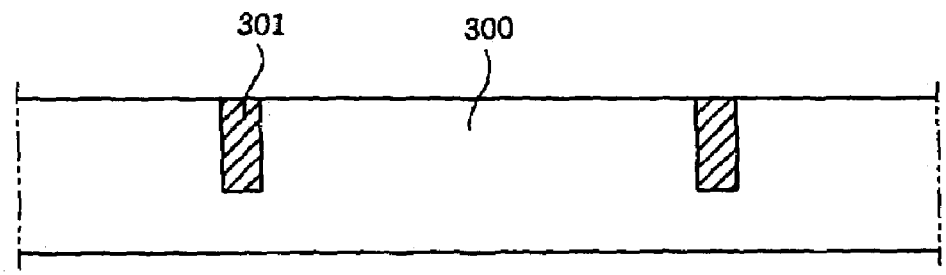
FIGS. 3A to 3F are cross sectional views illustrating formation of an example CMOS transistor constructed in accordance with the teachings of the present invention.

Hereinafter, the example method of FIG. 2 will be described with reference to FIGS. 3A to 3F. Turning to FIG. 3A, device isolation layers 301 are formed in predetermined regions of a semiconductor substrate 300 to define an active region and a field region. The device isolation layers 301, (usually a field oxide layer), are formed in the illustrated example by performing a local oxidation of silicon (LOCOS) method or a shallow trench isolation (STI) method.

Figure 3B:
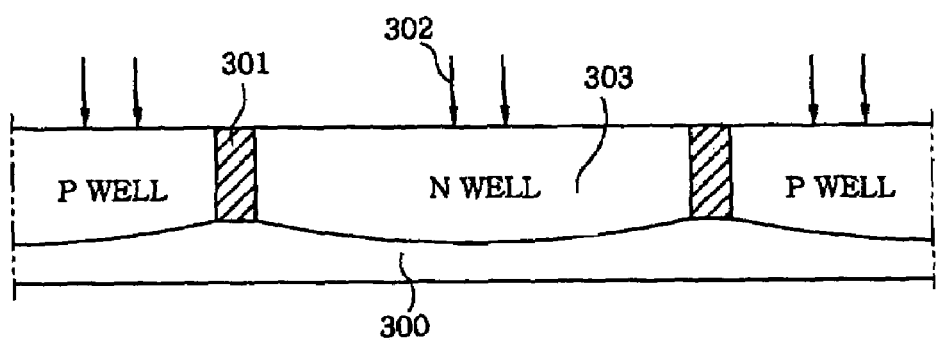

Next, as shown in FIG. 3B, well regions 303 are formed by performing ion implantation 302 on the semiconductor substrate 300 on which the CMOS transistors will be formed. That is, an N well region 303 is formed in a PMOS transistor region of the semiconductor substrate 300 and a P well region 303 is formed in a NMOS transistor region of the semiconductor substrate 300.

Figure 3C:
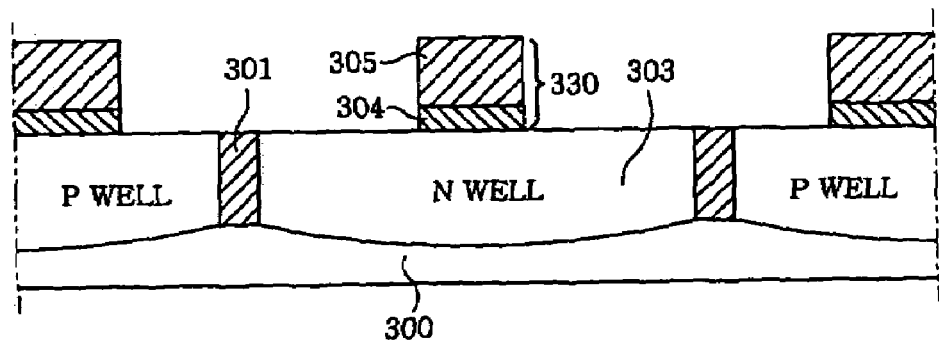

Subsequently, as shown in FIG. 3C, gate electrodes 330 are formed on the well regions 303 by sequentially forming a gate oxide layer 304 and a polysilicon layer 305, and then selectively etching them while using a mask. The polysilicon layer 305 can be formed by either depositing a polysilicon layer doped with impurities, or by performing ion implantation on a polysilicon layer which has been deposited without impurities.

Figure 3D:
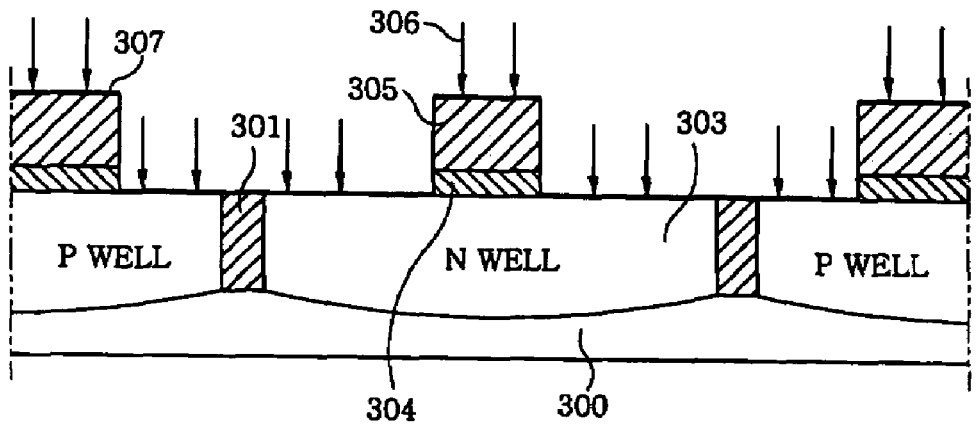

Next, as shown in FIG. 3D, nitrogen ion implantation 306 is performed on an upper surface of the gate electrodes 330 and on the semiconductor substrate 300, so that a thin nitride layer 307 doped with nitrogen is formed on the upper surface of the gate electrodes 330 and on the semiconductor substrate 300. In the illustrated example, the thickness of the nitride layer 307 is less than or equal to about 30 Å.

In the illustrated example, the aforementioned nitrogen ion implantation process is performed with energy of about 10 KeV~160 KeV at a dose of about $1 \times 10^{13}$ ions/cm$^2$~$1 \times 10^{16}$ ions/cm$^2$, and an ion implantation angle of about 0°~7°, so that nitrogen ions are projected almost perpendicularly to the semiconductor substrate 300. The nitride layer 307 may be formed by using plasma instead of the nitrogen ion implantation.

The nitride layer 307 formed on the upper surface of the gate electrodes 330 and on the semiconductor substrate 300 serves to expedite the growth of an oxide layer, (i.e., a screen oxide layer 308), in a subsequent process. The nitrogen implanted in the nitride layer 307 serves to suppress diffusion of boron (B) during an ensuing BF$_2$ implantation for forming a lightly doped drain (LDD) region 309 of the PMOS transistor, thereby stabilizing a well and a channel threshold voltage.

Figure 3E:
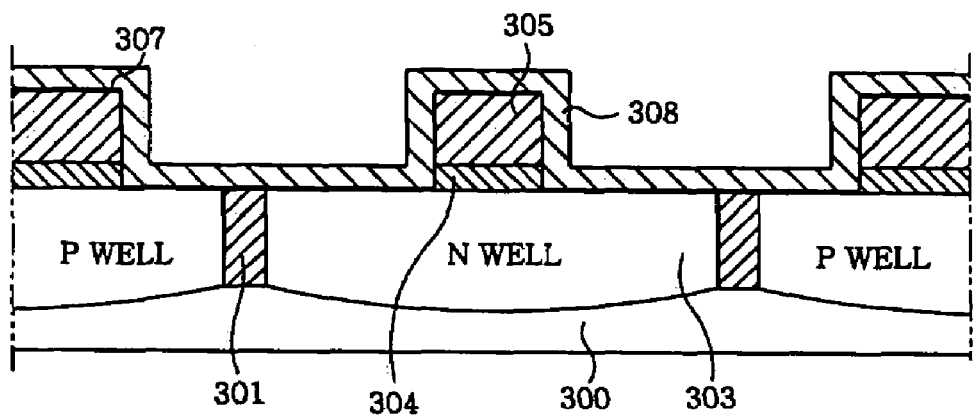

Subsequently, as shown in FIG. 3E, the screen oxide layer 308 is formed by performing a re-oxidization process on the surface of the thin nitride layer 307 and on the sidewalls of the gate electrodes 330. The screen oxide layer 308 cures or compensates for a degradation of the gate oxide layer 304 incorporated in the gate electrodes 330, due to the previously mentioned etching process. Moreover, the screen oxide layer 308 serves to protect the semiconductor substrate 300 when an ion implantation process for forming the LDD region is subsequently performed.

Figure 3F:
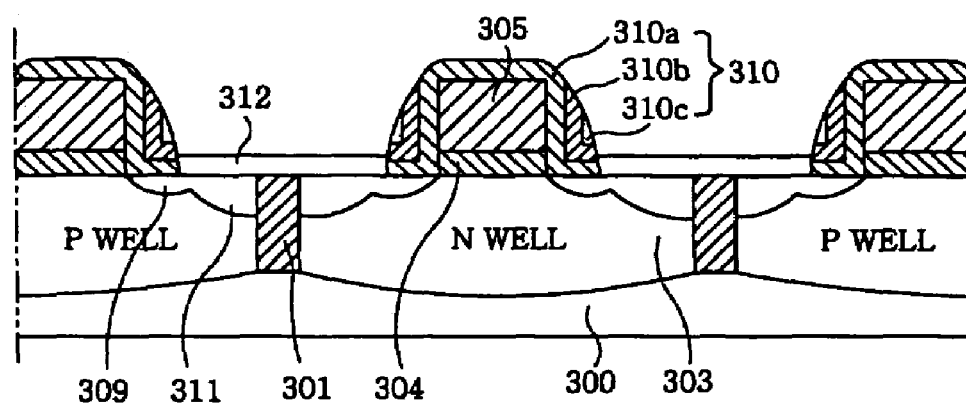

Next, as shown in FIG. 3F, the LDD regions 309 to avoid hot carrier creation are formed by performing an ion implantation process. The LDD regions are aligned with corresponding edges of the gate electrodes 330. In the illustrated example, a low concentration N type (n$^-$) LDD is formed in the NMOS transistor region of the semiconductor substrate 300 and a low concentration P type (p$^-$) LDD is formed in the PMOS transistor region of the semiconductor substrate 300.

The screen oxide layer 308 on the surface of the gate electrodes 330, on the semiconductor substrate 300 and on the sidewalls of the gate electrodes 330 is removed by, for example, a sulfuric cleaning process. The nitride layer 307 is also removed. Subsequently, spacers 310 are formed on the sidewalls of the gate electrodes 330. In the illustrated example, the spacers 310 have a structure comprising a spacer nitride layer 310c, a buffer oxide layer 310b and a sealing nitride layer 310a (i.e., a N/O/N structure). Alternatively, the spacers 310 may be formed to have a two-layer structure consisting of a nitride layer and an oxide layer.

Subsequently, source/drain regions 311 are formed in the semiconductor substrate 300 by performing an ion implantation process. The source/drain regions are aligned with corresponding edges of the spacers 310 and expand from the adjacent LDD region 309.

High concentration N type (n$^+$) source/drain regions 311 are formed in the NMOS transistor region of the semiconductor substrate 300 and high concentration P type (p$^+$) source/drain regions 311 are formed in the PMOS transistor region of the semiconductor substrate 300.

Next, a silicide layer 312 is formed on the source/drain regions 311 in order to reduce the contact resistance, thereby completing the fabrication of the CMOS transistor.

Although in the above described examples a single polysilicon layer is used as a gate conducting layer in the gate electrodes, a laminated polyside structure including a polysilicon layer and a metal silicide layer may alternatively be used in the gate electrodes. Any of a tungsten layer, a tungsten nitride layer, a tungsten silicide layer, a TiN layer, a Ti layer or a combination thereof can be used in the gate electrodes.

Since the length of time required to form the screen oxide layer 308 can be shortened by about 30%~50% by forming a nitride layer 307 before forming the screen oxide layer 308, a thermal budget can be phenomenally saved. In addition, since the nitrogen doped in the nitride layer 307 below the screen oxide layer 308 suppresses the diffusion of boron which would otherwise occur during a BF$_2$ ion implantation process for forming an LDD region of a PMOS transistor, a well and a channel threshold voltage can be stabilized, thereby improving the performance of the fabricated transistor.

From the foregoing, persons of ordinary skill in the art will appreciate that methods for forming a CMOS transistor have been disclosed. The illustrated methods are capable of preventing degradation of the fabricated transistor's characteristics which would otherwise result from a re-oxidation process which, in the prior art, was performed at a high temperature for a relatively long time.

An illustrated method for forming a field effect transistor comprises: forming a gate electrode on a substrate; and forming a nitride layer on at least a part of the gate electrodes and the substrate.

It is noted that this patent claims priority from Korean Patent Application Serial Number 10-2003-0100531, which was filed on Dec. 30, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for forming a field effect transistor comprising:

forming a gate electrode on a substrate;

performing nitrogen ion implantation on the gate electrode and the substrate to form a nitride layer at top surfaces of the gate electrode and the substrate that expedites subsequent growth of an oxide; and after forming the nitride layer, forming a screen oxide layer on the nitride layer by an oxidation process.

2. A method as defined in claim 1, wherein the nitrogen ions are implanted at an energy level of about 10 KeV~160 KeV.

3. A method as defined in claim 1, wherein the nitrogen ions are implanted at a dose of about $1\times10^{13}$ ions/cm$^2$~$1\times10^{16}$ ions/cm$^2$.

4. A method as defined in claim 1, wherein an injection angle of the nitrogen ion implantation is about 0°~7°.

5. A meted as defined in claim 1, wherein a thickness of the nitride layer is less than or equal to about 30 Å.

6. A method as defined in claim 1, wherein forming the gate electrode comprises forming a gate oxide layer on a surface of the substrate, forming a gate conducting layer on the gate oxide layer, and etching the gate oxide layer and the gate conducting layer.

7. A method as defined in claim 6, wherein the gate conducting layer comprises at least one layer selected from the group consisting of: a polysilicon layer, a tungsten nitride layer, a tungsten suicide layer, a TiN layer, a Ti layer and a layer including two or more of polysilicon, tungsten nitride, tungsten suicide, TiN and Ti.

8. A method for forming a field effect transistor comprising:

forming a gate electrode on a substrate;

performing nitrogen ion implantation on the gate electrode and the substrate to form a nitride layer at top surfaces of the gate electrode and the substrate;

after forming the nitride layer, forming a screen oxide layer on the nitride layer;

forming a lightly doped drain region in the substrate;

removing the screen oxide layer and the nitride layer;

forming a spacer on a sidewall of the gate electrode; and forming a source/drain region in the substrate adjacent to the lightly doped drain region.

9. A method as defined in claim 8, wherein the nitrogen ions are implanted at an energy level of about 10 KeV~160 KeV.

10. A method as defined in claim 8, wherein the nitrogen ions are implanted at a dose of about $1\times10^{13}$ ions/cm$^2$ $1\times10^{16}$ ions/cm$^2$.

11. A method as defined in claim 8, wherein an injection angle of the nitrogen ion implantation is about 0°~7°.

12. A method as defined in claim 8, wherein a thickness of the nitride layer is less than or equal to about 30 Å.

13. A method as defined in claim 8, wherein forming the gate electrode comprises: forming a gate oxide layer on a surface of the substrate, forming a gate conducting layer on the Late oxide layer, and etching the gate oxide layer and the gate conducting layer.

14. A method as defined in claim 13, wherein the gate conducting layer comprises at least one layer selected from the group consisting of: a polysilicon layer, a tungsten nitride layer, a tungsten suicide layer, a TiN layer, a Ti layer and a layer including two or more of polysilicon, tungsten nitride, tungsten silicide, TiN and Ti.

* * * * *